US010651153B2

(12) United States Patent
Fastow et al.

(10) Patent No.: US 10,651,153 B2
(45) Date of Patent: May 12, 2020

(54) THREE-DIMENSIONAL (3D) MEMORY WITH SHARED CONTROL CIRCUITRY USING WAFER-TO-WAFER BONDING

(71) Applicant: Intel Corporation, Santa Clara, CA (US)

(72) Inventors: Richard Fastow, Cupertino, CA (US); Khaled Hasnat, San Jose, CA (US); Prashant Majhi, San Jose, CA (US); Owen Jungroth, Sonora, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/011,139

(22) Filed: Jun. 18, 2018

(65) Prior Publication Data

US 2019/0043836 A1  Feb. 7, 2019

(51) Int. Cl.
*H01L 27/11548* (2017.01)
*H01L 27/11556* (2017.01)
(Continued)

(52) U.S. Cl.
CPC ...... *H01L 25/0657* (2013.01); *G11C 16/0483* (2013.01); *G11C 16/08* (2013.01); *H01L 24/02* (2013.01); *H01L 24/73* (2013.01); *H01L 25/0652* (2013.01); *H01L 27/0688* (2013.01); *H01L 27/11548* (2013.01); *H01L 27/11556* (2013.01); *H01L 27/11573* (2013.01); *G11C 5/025* (2013.01); *H01L 24/08* (2013.01); *H01L 24/16* (2013.01); *H01L 25/50* (2013.01); *H01L 27/11575* (2013.01); *H01L 27/11582* (2013.01); *H01L 2224/08145* (2013.01);
(Continued)

(58) Field of Classification Search
CPC .............. H01L 27/11548; H01L 27/11556
USPC .......................................................... 257/777
See application file for complete search history.

(56) References Cited

U.S. PATENT DOCUMENTS 7,193,239 B2   3/2007   Leedy
9,530,790 B1   12/2016  Lu et al.
(Continued)

FOREIGN PATENT DOCUMENTS

| CN | 107731828 A   | 2/2018 |
|----|---------------|--------|
| CN | 107887395 A   | 4/2018 |
| WO | 2019104896 A1 | 6/2019 |

OTHER PUBLICATIONS

First Office Action for U.S. Appl. No. 16/011,129, dated Apr. 4, 2019, 15 pages.

(Continued)

*Primary Examiner* — Igwe U Anya
(74) *Attorney, Agent, or Firm* — Compass IP Law, PC

(57) ABSTRACT

Wafer-to-wafer bonding is used to form three-dimensional (3D) memory components such as 3D NAND flash memory with shared control circuitry on one die to access arrays on multiple dies. In one example, a non-volatile storage device includes a first die including a 3D array of non-volatile storage cells and CMOS (complementary metal oxide semiconductor) circuitry. A second die including a second 3D array of non-volatile storage cells is vertically stacked and bonded with the first die. At least a portion of the CMOS circuitry of the first die to access both the first 3D array of non-volatile storage cells of the first die and the second 3D array of non-volatile storage cells of the second die.

17 Claims, 11 Drawing Sheets

(51) Int. Cl.
  *H01L 25/065* (2006.01)
  *G11C 16/08* (2006.01)
  *H01L 23/00* (2006.01)
  *G11C 16/04* (2006.01)
  *H01L 27/11573* (2017.01)
  *H01L 27/06* (2006.01)
  *H01L 27/11575* (2017.01)
  *H01L 27/11582* (2017.01)
  *H01L 25/00* (2006.01)
  *G11C 5/02* (2006.01)

(52) U.S. Cl.
  CPC ........... *H01L 2224/16145* (2013.01); *H01L 2224/73265* (2013.01); *H01L 2224/80895* (2013.01); *H01L 2225/0651* (2013.01); *H01L 2225/06506* (2013.01); *H01L 2225/06527* (2013.01); *H01L 2225/06562* (2013.01); *H01L 2225/06565* (2013.01); *H01L 2924/1438* (2013.01)

(56) References Cited

U.S. PATENT DOCUMENTS

| | | | |
|---|---|---|---|
| 9,876,031 B1* | 1/2018 | Shimizu | H01L 27/11582 |
| 10,283,493 B1* | 5/2019 | Nishida | H01L 25/18 |
| 10,381,362 B1 | 8/2019 | Cui et al. | |
| 2010/0013107 A1 | 1/2010 | Sandhu et al. | |
| 2012/0074466 A1 | 3/2012 | Setiadi et al. | |
| 2015/0031189 A1 | 1/2015 | Chen et al. | |
| 2016/0079164 A1 | 3/2016 | Fukuzumi et al. | |
| 2016/0099228 A1 | 4/2016 | Franca-Neto | |
| 2017/0179153 A1* | 6/2017 | Ogawa | H01L 27/11524 |
| 2019/0221557 A1* | 7/2019 | Kim | H01L 24/08 |

OTHER PUBLICATIONS

Extended European Search Report for Patent Application No. 19173106.6, dated Sep. 23, 2019, 8 pages.

Final Office Action for U.S. Appl. No. 16/011,129, dated Oct. 21, 2019, 18 pages.

\* cited by examiner

THREE-DIMENSIONAL (3D) MEMORY WITH SHARED CONTROL CIRCUITRY USING WAFER-TO-WAFER BONDING

FIELD

The descriptions are generally related to three-dimensional (3D) memory and storage devices, and more particular descriptions are related to forming 3D flash memory with shared CMOS circuitry using wafer-to-wafer bonding.

BACKGROUND

Flash storage, such as NAND flash memory, is a nonvolatile storage medium. Nonvolatile storage refers to a storage having a state that is determinate even if power is interrupted to the device. Flash memory can be used as memory (e.g., system memory) or as a storage device. There is a trend for systems across the mobile, client, and enterprise segments to use flash memory for storage (e.g., such as solid state drives (SSDs)). One type of NAND flash memory is three dimensional (3D) NAND flash memory, in which vertical NAND strings make up the storage array. Although the 3D NAND flash arrays can store more bits in a given area than two dimensional (2D) NAND, there is continued interest in denser, faster, and more power efficient data storage.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

Techniques for forming three-dimensional (3D) memory components with shared control circuitry using wafer-to-wafer bonding are described herein.

One type of 3D memory is 3D flash memory, which can also be referred to as 3D flash storage. One example of 3D flash memory is 3D NAND (not AND) flash memory. 3D memory includes one or more arrays of storage cells and control circuitry to access the storage cells. Typically, control circuitry for accessing 3D flash storage arrays includes CMOS (complementary metal oxide semiconductor) circuitry. The control or CMOS circuitry can also be referred to as the "periphery." A typical 3D flash memory device includes one or more arrays and separate CMOS circuitry to control each array. The CMOS circuitry is typically considered overhead that decreases the area available for storage cells.

In contrast to conventional 3D flash memory, 3D flash storage components described herein include shared CMOS circuitry. Shared CMOS circuitry controls or enables access to memory arrays on multiple dies. In one example, multiple wafers are processed separately. At least one of the wafers includes shared CMOS circuitry. The wafers are vertically stacked and bonded together. Interconnects couple the shared CMOS circuitry with arrays on two or more wafers. Only one wafer in the stack or multiple wafers in the stack can include shared CMOS circuitry for accessing arrays on the multiple wafers. In one example, multiple wafers each include shared CMOS circuitry. In one example in which two wafers each include shared CMOS circuitry, a portion (e.g., half) of string driver circuitry is located in the CMOS circuitry of one wafer and the remaining portion of string driver circuitry is located in CMOS circuitry of another wafer. In one such example, the string driver circuitry located across both dies is used to access the arrays on both dies. Other types of CMOS circuitry can be split and shared between multiple wafers or shared and located on only one of the wafers.

Thus, wafer-to-wafer bonding used to connect the periphery regions of two or more dies together, so that the same periphery area and power can be amortized across more than one die. Sharing the same periphery circuitry across multiple die results in reduced die area and reduced power. This translates into lower cost per gigabyte (GB) and lower power for the same performance.

Figure 1A:
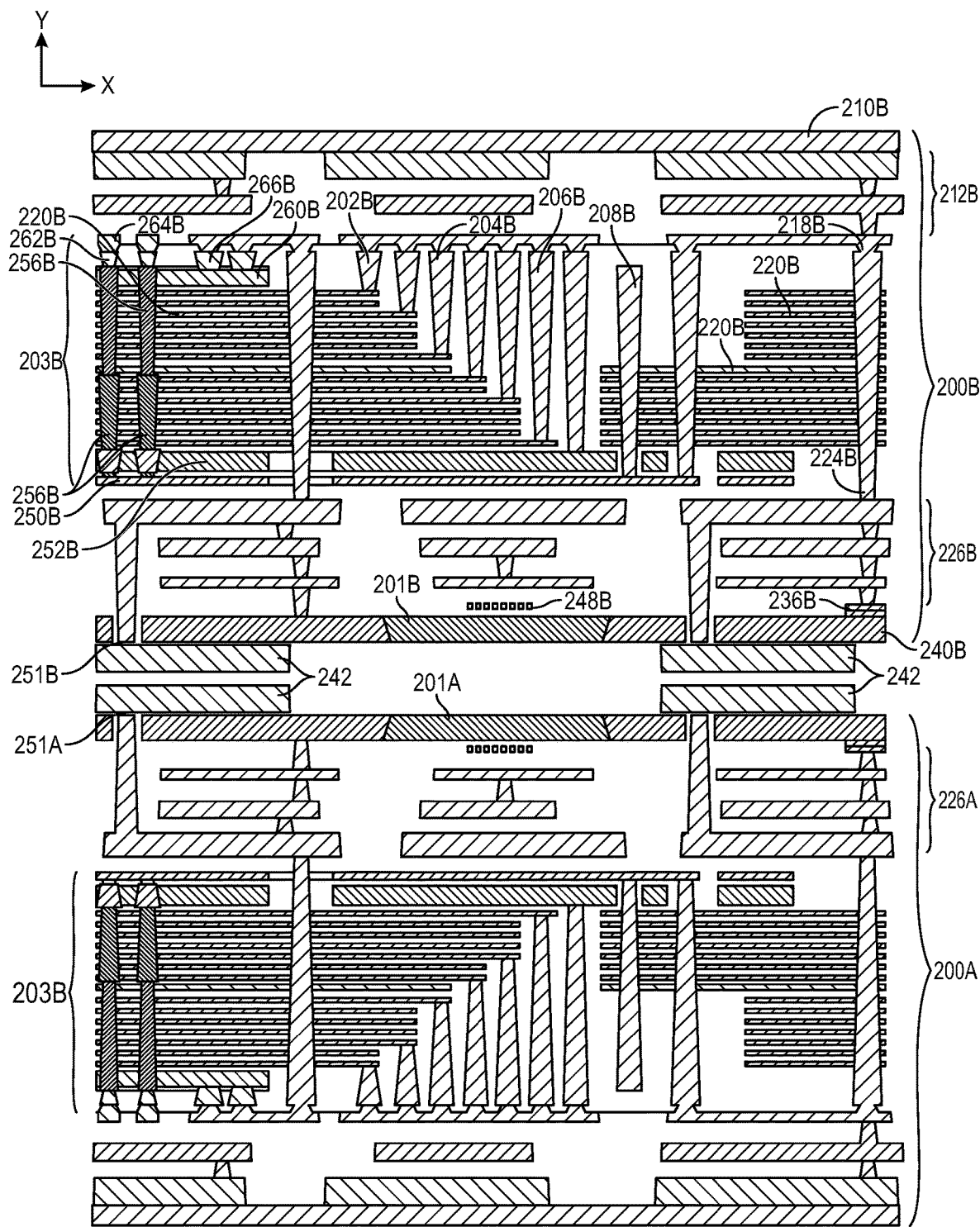
FIG. 1A illustrates a cross section of an example of a 3D flash storage component with shared CMOS circuitry formed using wafer bonding.

FIG. 1A illustrates a cross section of an example of a 3D flash storage component with shared CMOS circuitry formed using wafer bonding. The component in FIG. 1A includes two dies (or "dice" or "die") 200A and 200B that are bonded together. Bonding the two dies 200A and 200B together can be accomplished by bonding the wafers together that include the dies, and then dicing the wafer. Each of the two dies 200A and 200B include a flash storage array and CMOS circuitry for controlling and accessing the array.

Referring to die 200B, the storage array includes the storage cells (e.g., storage cells formed at pillars 256B) and conductive access lines to enable access to the storage cells (e.g., bitlines 264B (which are coming out of the page in FIG. 1A), wordlines 220B, SGS (select gate source) 252B, SGD (select gate drain) 260B). In the illustrated example, a source plate 250B is located between the pillars 256B and the conductive interconnects 226B. Between the CMOS circuitry and the array, each die includes conductive interconnects to couple the array with the CMOS circuitry. For example, referring to the die 200B, the interconnects 226B couple the CMOS circuitry 201B with the array 203B. In the illustrated example, a layer of poly (polysilicon) 236B is between the conductive interconnects 226B and the CMOS circuitry. Additional conductive layers (e.g., 212B, 218B, and vias 202B, 204B, 206B, 208B, 224B, 262B, and 266B) enable coupling the array to the CMOS circuitry or coupling the CMOS circuitry to other circuitry external to the storage component. In the illustrated example, the vias are coupled with the wordlines 220B in a staggered or staircase like configuration. The die 200A also includes an array 203A and interconnects 226A, which can be the same or similar to those of the die 200B. In the example illustrated in FIG. 1A, the features of die 200A are flipped or mirrored relative to the die 200B.

In the example illustrated in FIG. 1A, the arrays 203A and 203B are 3D flash arrays. The arrays 203A and 203B may be built using three-dimensional (3D) circuitry so that memory cells are built on top of the substrate. Such 3D circuit techniques may use the substrate as a mechanical base for the memory array without using the substrate itself for the circuitry of the memory array. In other examples, part of the array can be formed in the substrate. The array can include any type of 3D memory such as floating gate flash memory, charge-trap (e.g., replacement gate) flash memory, phase-change memory, resistive memory, ovonic memory, ferro-electric transistor random access memory (FeTRAM), nanowire memory, or any other 3D memory. In one example, the 3D flash array is a stacked NAND flash array, which stacks multiple floating gate or charge-trap flash memory cells in a vertical stack wired in a NAND (not AND) fashion. In another example, the 3D flash array includes NOR (not OR) storage cells.

In the example illustrated in FIG. 1A, the arrays 203A and 203B includes pillars which form the storage cells, such as NAND flash storage cells. FIG. 1A illustrates two decks on each die, where each deck includes multiple tiers (layers). However, other examples may include arrays with one deck or more than two decks. In an example in which the storage cells include floating gate transistors, the cells can be programmed by charging a floating gate of the storage cell. The floating gate typically includes a conductive or semiconductor material. In an example in which the storage cells include charge trap, the storage cell can be programmed by storing charge in a charge trap. A charge trap typically includes an insulating material (such as silicon nitride or another insulating material capable of storing charge). Other storage cell technologies to enable storing data may also be used.

Under the array 203B is the control circuitry 201B. In one example, the control circuitry 201B includes CMOS circuitry (and therefore is referred to as "CMOS under array" or CuA). In one such example, the CMOS circuitry is formed first in the substrate 2406, followed by formation of conductive interconnects over the CMOS circuitry 201B, and the array 203B is built on top of the interconnects 226B and CMOS circuitry 201B. It is also possible to form the CMOS circuitry next to the storage array. In one such example, part of the substrate is used to build an array, and another part of the substrate is used to build the CMOS circuitry adjacent to the array, and there are interconnects between the CMOS circuitry and the array. One advantage of forming the CMOS circuitry under the array instead of next to the array is a reduction in the total chip area. In another example, the CMOS circuitry can be located partially under the array and partially next to the array. Regardless of whether the control circuitry is under or next to the array, the control circuitry may be referred to as the "periphery."

The control circuitry 201A and 201B includes circuitry to control access to the arrays 203A and 203B. The control circuitry 201A and 201B includes one or more of: address decoders, line drivers, sense amplifiers, charge-pumps, state machines, buffers, or various other types of circuitry. The control circuit 201A and 201B typically includes transistors. In one example, the control circuitry 201A and 201B includes n-channel metal-oxide semiconductor field-effect transistors (MOSFET), p-channel MOSFETs, or both. The control circuitry 201A and 201B can also include poly routing 248A and 248B, respectively. The control circuitry 201A and 201B is coupled with the access lines using vias to allow electrical communication between the control circuitry 201A and 201B and the access lines, and thus enable access to the storage cells. The conductive access lines, conductive interconnects, and vias are formed from a conductive (e.g., metal) or semiconductive material to enable electrical coupling between components.

The 3D flash storage component in FIG. 1A includes a second die 200A under and bonded with the die 200B. Thus, unlike a conventional 3D flash storage component including a single die, multiple dies (each with multiple layers or tiers) are stacked and bonded together. The dies 200A and 200B are bonded together via a wafer-to-wafer bonding process. In the example illustrated in FIG. 1A, prior to bonding, one of the wafers is flipped so that CMOS circuitry 201A of die 200A is facing the CMOS circuitry 201B of die 200B. Note that even though the CMOS circuitry 201A appears to be "over" the array as illustrated in FIG. 1A, the die 200A can still be considered a CMOS under the array (CuA) implementation because the array is formed over the CMOS circuitry prior to the wafer being flipped. Through the wafer-to-wafer bonding process, the CMOS circuitry 201B of the die 200B and the CMOS circuitry 201A of the die 200A are electrically coupled together. In the illustrated example, wafer bonding pads 242 are included between the two dies 200A and 200B. In the example illustrated in FIG. 1A, wafer bonding pads are applied to each wafer (e.g., bonding pads are applied to the wafer including die 200A and to the wafer including die 200B), and the wafers are bonded together at the wafer bonding pads 242. In one such example, any space between the wafers (e.g., space between the bonding pads in the x-direction and between the wafers in the y direction) can be air or filled with a filler material, such as an insulator, to provide structural support.

Although the illustrated example includes bonding pads 242 between the dies 200A and 200B, bonding pads may or may not be used to bond the wafers. In an example in which there are no bonding pads, any conductive surface exposed at the bottom of one wafer can be bonded to an exposed conductive surface at the top of another wafer. For example, exposed conductive interconnect surfaces (e.g., surfaces 251A and 251B) of each wafer can be bonded together. Thus, the bonding can include "via-to-via" or "metal-to-metal" bonding without intervening bonding pads. Very good alignment of the dies (e.g., alignment of the conductive interconnect surface 251A with the surface 251B) can enable bonding the wafers without bonding pads. In an example with bonding pads, bonding pads that are smaller (e.g., smaller in the x and z directions) than traditional bonding pads can enable coupling the CMOS circuitry of each of the dies 200A and 200B. The bonding pads for wafer-to-wafer bonding are smaller than normal bond pads because there are so many signals to be bonded. The smaller bonding pads are a challenge because the alignment requirements are tight. In one example, the bonding pads have a size that is on the order of the contact size. In one such example, the bonding pads 242 have a width of 0.5 micron or less, compared to conventional bonding pads having a width that is 10 s of microns or larger.

Stacking and bonding the dies together can enable sharing of control circuitry in a variety of ways to decrease the area occupied by the control circuitry, improve performance, and/or reduce power usage. Because of the electrical connection through the bonded contacts (through the bonding pads 242 in the illustrated example), the periphery regions of the top and bottom wafers can be shared, and duplicate circuitry removed. Removing duplicate circuitry helps with fitting the periphery circuitry under the array and reduces the power consumed by the CMOS circuitry. One or more than one of the dies can include control circuitry. In the example illustrated in FIG. 1A, both dies 200A and 200B include control circuitry. Where both dies include control circuitry, at least one of the dies includes shared circuitry; however, multiple (up to all) dies can include shared circuitry. The shared circuitry can involve splitting circuitry across the dies (e.g., including half the string drivers on one die and half the string drivers on the other die) or forming one type of control circuitry on one of the dies and a different type of control circuitry on the other die (e.g., string drivers on one of the dies and page buffers on another die, or any other division of control circuitry). In one example, the top die 200B includes the charge pumps, static page buffers, half of the string driver, and the IOs. The bottom die 200A includes the control logic, static page buffers, half of the string driver, and the pads. The electrical connection through the bonding pads enables both dies to have access to the CMOS on both wafers.

In one example, different classes of transistors (e.g., high voltage (HV) transistors or low voltage (LV) transistors) are put on the two different wafers. Forming different classes of transistors on different wafers can reduce cost by forming more expensive classes of transistors (e.g., HV transistors) on only one (or fewer than all) of the wafers. In one example, charge pumps, string drivers, and voltage regulators use high voltage transistors with thick gate oxide. Logic circuits, data path circuits, and the static page buffer use high speed, low voltage devices with thin gate oxide. Thus, in one example, the CMOS circuitry on one wafer includes one or more of the charge pumps, string drivers, and voltage regulators and does not include circuitry using the low voltage devices (e.g., logic circuits, data path circuits, and static page buffers). In this example, the CMOS circuitry on another wafer would include the circuitry using the low voltage devices (e.g., one or more of logic circuits, data path circuits, and static page buffers) and does not include the circuitry using the high voltage devices (e.g., charge pumps, string drivers, and voltage regulators).

In another example (not shown), one die is composed of an array plus the CMOS, while the second die contains the array, only. This reduces the processing cost of the second wafer and the overall cost per gigabyte (GB), although it comes with a performance downside.

Figure 1B:
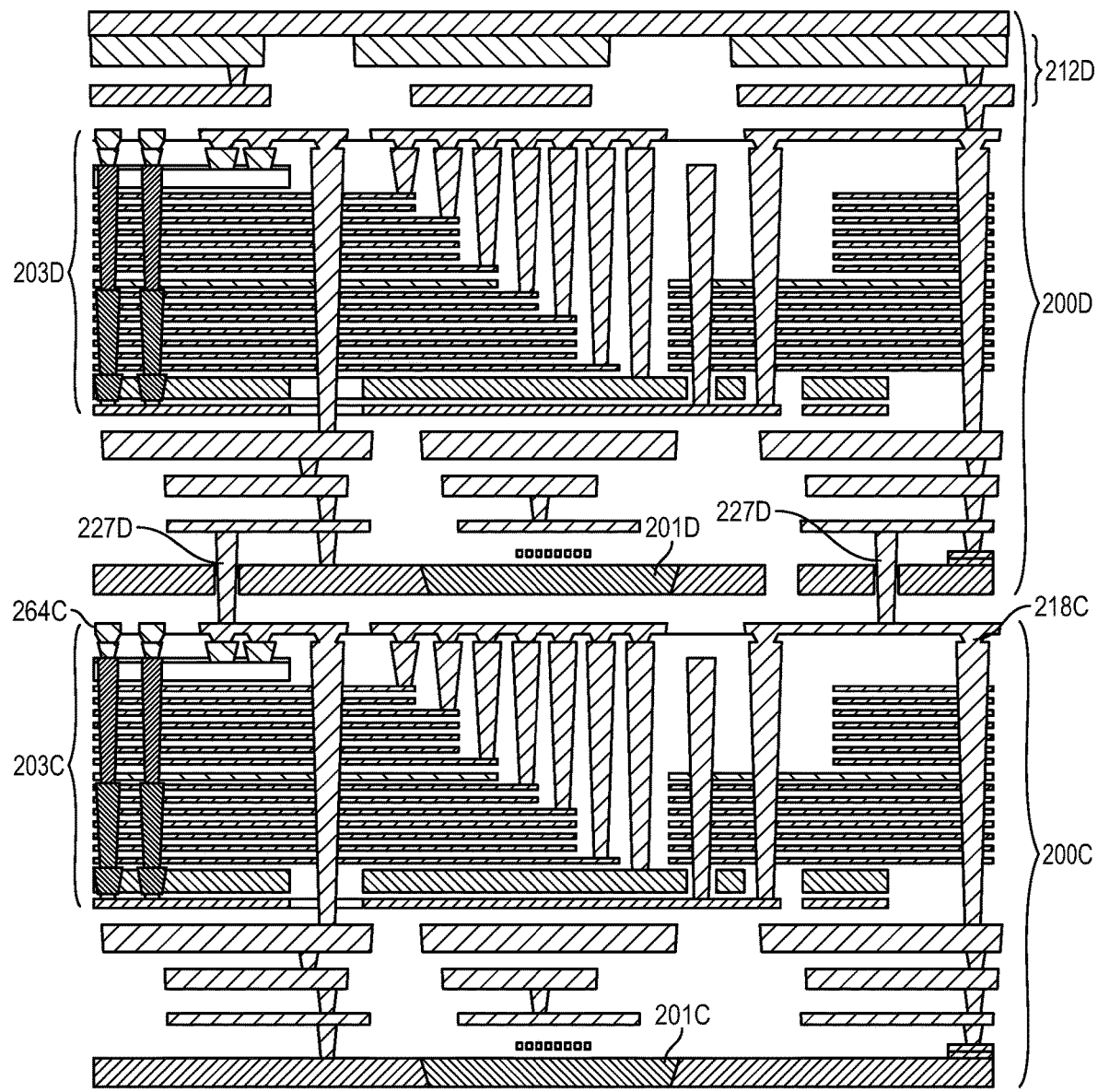
FIG. 1B illustrates a cross section of an example of a 3D flash storage component with shared CMOS circuitry formed using wafer bonding.

FIG. 1B illustrates a cross section of another example of a 3D flash storage component with shared CMOS circuitry formed using wafer bonding. The 3D flash storage component in FIG. 1B is similar to the component in FIG. 1A, except that the dies in FIG. 1B are stacked and bonded without flipping one of the dies. Therefore, the die 200C and 200D have the same orientation. As a result of the orientation and bonding location of the dies, the CMOS circuitry 201C of the die 200C and the CMOS circuitry 201D of the die 200D are not adjacent to one another. Accordingly, in order to share the CMOS circuitry between the two dies, vias are used to electrically couple the CMOS circuitry of the dies. In the example illustrated in FIG. 1B, there is not a single via directly connecting the CMOS circuits. The wafers are bonded with vias 227D, but then must go through several metal and via layers (e.g., conductive interconnect 218C).

Also, in contrast to the example illustrated in FIG. 1A, FIG. 1B illustrates an example without bonding pads. Thus, the die 200C and the die 200D are bonded together at the exposed bottom surface of the vias 227D and the exposed upper surface of the bitlines 264C. Area between the bonding points can be air or can be filled with an insulating material. In the illustrated example, some of the metal layers and a passivation layer can be eliminated. For example, the die 200C does not include additional metal layers and a passivation layer (such as the conductive interconnects 212B of FIG. 1A and the passivation layer 210B) over the bitlines 264C. Unlike conventional 3D NAND devices, the metals 212D on the top of the array 203D can also be used for accessing the circuitry on die 200C (in addition to being used for die 200D), and therefore additional metal layers for the die 200C can be eliminated. Thus, although the illustrated example can enable a reduction in cost by eliminating one or more layers, the connections between the CMOS circuitry of the two dies is longer than if one of the dies is flipped relative to the other.

Like FIG. 1A, the component in FIG. 1B includes shared CMOS circuitry. The CMOS circuitry 201C, 201D, or both can include shared circuitry for accessing both the array 203C on the first die 200C and the array 203D on the die 200D. Thus, FIGS. 1A and 1B illustrate two different examples of using wafer bonding to share the periphery circuit between two or more dies. As mentioned previously, the use of wafer to wafer bonding is not limited to two dies. By fabricating vias which transverse a thinned die, connections can be made through a stack of multiple die. This enables the periphery to be shared across multiple die, which can be used to further reduce the die area and power. An additional benefit of this approach is that the packaging costs can be reduced, as connections between die already exist. Sharing the periphery circuit between two or more independent dies can enable reducing the die size in a design constrained by the CuA and to increase (e.g., double) the number of planes in each die. The memory cells in a 3D NAND memory are grouped into planes (e.g., where a plane typically includes 16 k bytes, but can be smaller or larger in size). All the bits in a plane are read from or written to in parallel. The user can read or write multiple planes in parallel so having more planes gives the user better performance. Sharing the periphery can also enable power/performance improvements. For example, if the number of planes is increased, the throughput/power is higher because the periphery power consumption is amortized across a larger number of planes. Even in the case that a die is not necessarily CuA limited, wafer-to-wafer bonding and shared CMOS circuitry can enable other optimizations, such as reducing the die footprint. For example, if a die is too large to fit into a package, it can be divided into two dies which are then bonded together (see, for example, FIG. 4B, discussed below).

Figure 2A:
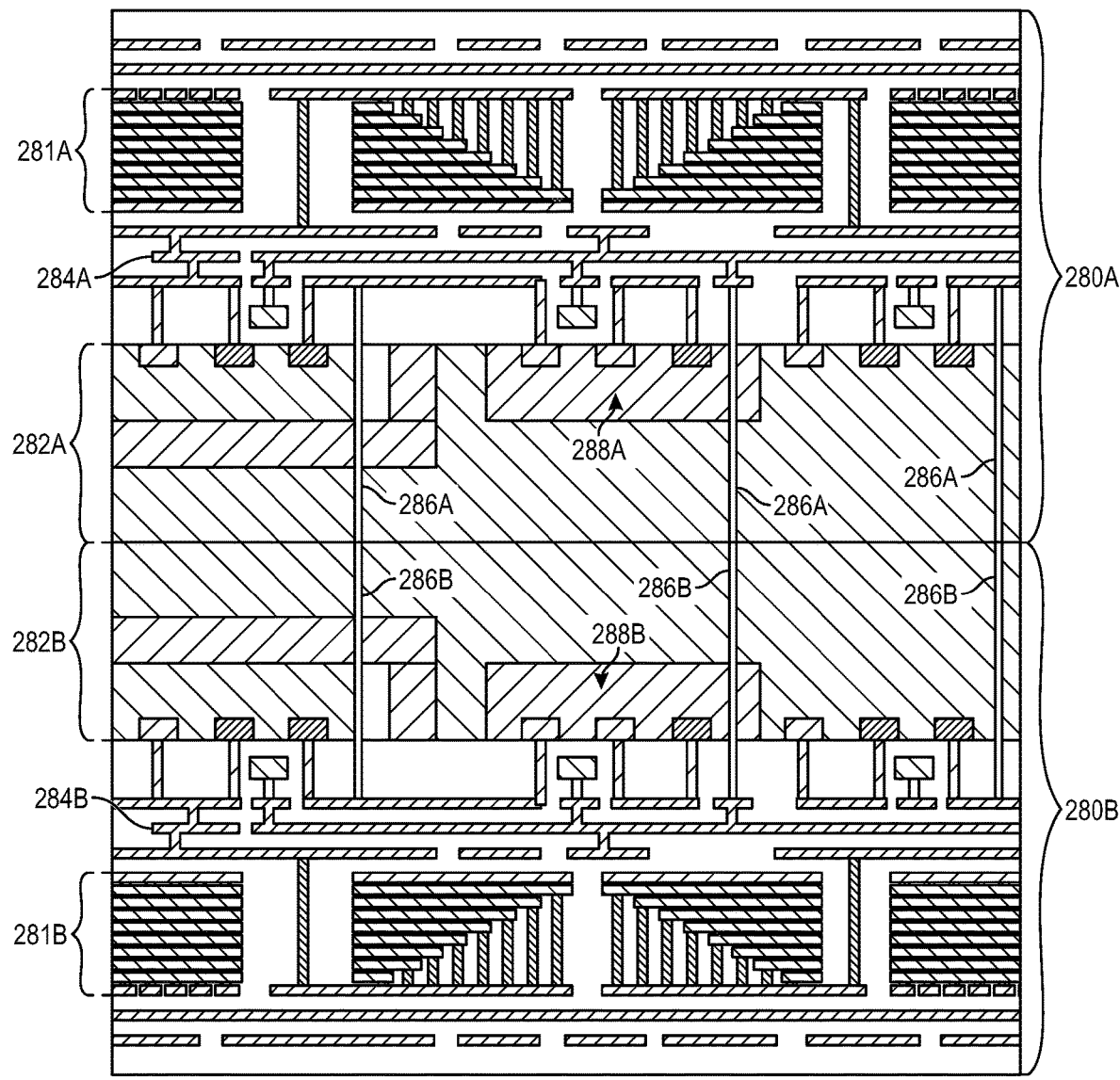
FIG. 2A illustrates a cross section of an example of a 3D flash storage component with two wafers bonded substrate-to-substrate.
Figure 2B:
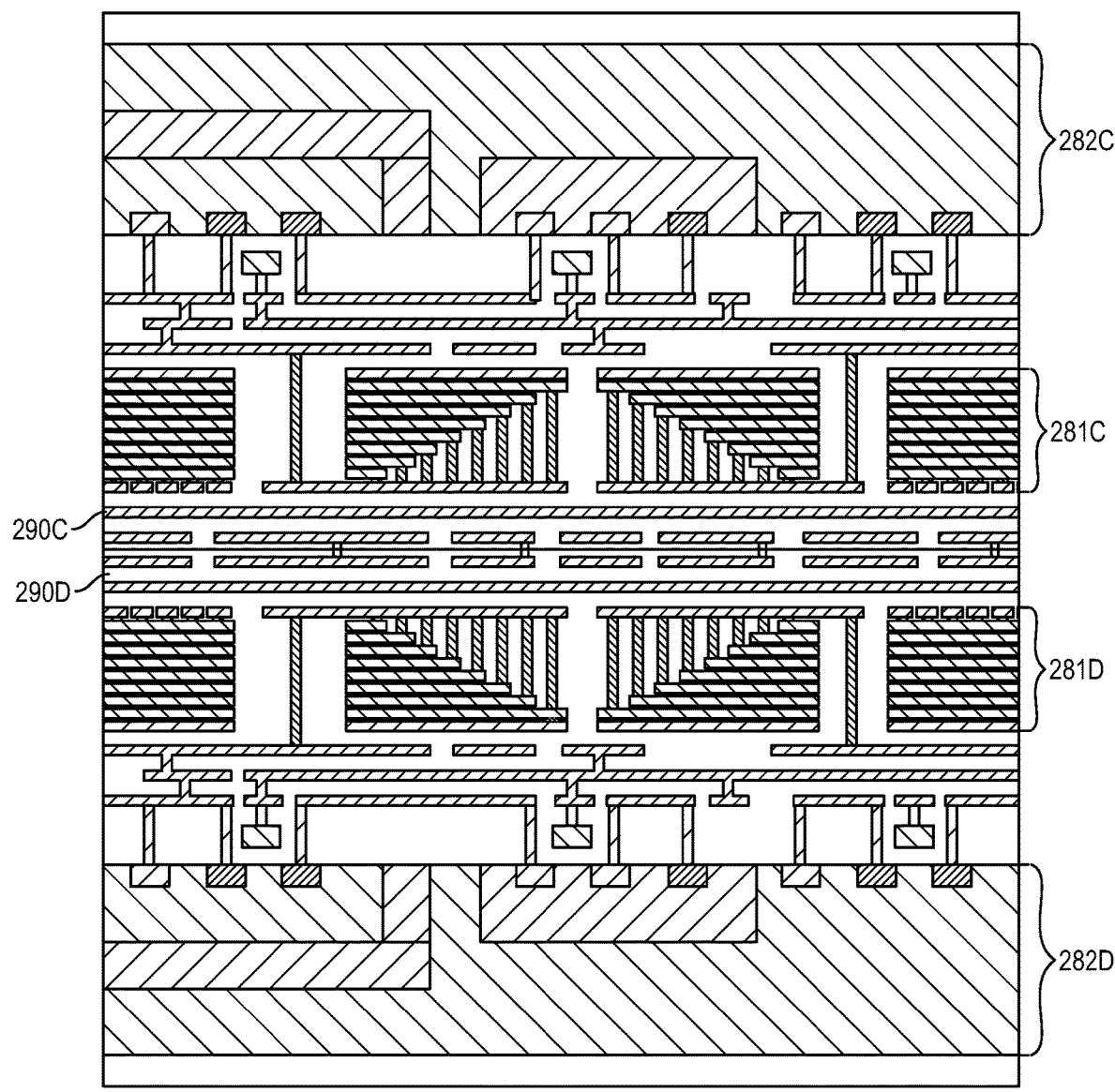
FIG. 2B illustrates a cross section of an example of a 3D flash storage component with two wafers bonded top metal-to-top metal.

FIGS. 2A and 2B also illustrate cross sections of examples of 3D flash storage components. FIG. 2A illustrates a 3D flash storage component with two wafers bonded substrate-to-substrate, and FIG. 2B illustrates a 3D flash storage component with two wafers bonded top metal-to-top metal. Thus, the component in FIG. 2A is similar to the component illustrated in FIG. 1A in that one of the wafers is flipped so that the CMOS circuitry of the wafers are facing each other.

Like FIG. 1A and one 1B, the 3D flash storage components in FIGS. 2A and 2B each include two dies bonded together via wafer bonding, each die including a storage array and CMOS circuitry. For example, FIG. 1A illustrates the dies 280A and 280B. Referring to die 280A, the CMOS circuitry 282A is under the array 281A, and there are conductive interconnects 284A coupling the array 281A with the CMOS circuitry 282A. The CMOS circuitry 282A can be the same or similar to CMOS circuitry described with respect to FIGS. 1A and 1B. Similarly, the die 280B includes CMOS circuitry 282B "under" the array 281B and coupled with the conductive interconnects 284B.

In the example illustrated in FIG. 2A, the CMOS circuitry 282A and 282B across both dies 280A and 280B includes shared string drivers 288A and 288B. The string drivers include transistors to drive the wordlines of the arrays 281A and 281B. A conventional 3D flash storage component would include string driver circuitry dedicated for driving only the array on that die. In contrast, in the example illustrated in FIG. 2A, half of the string drivers are on one die and the other half of the string drivers are on the other die, where the string drivers on both dies drive the arrays on both dies. For example, the string drivers to drive odd wordlines could be on the top die 280A and the string drivers to drive even wordlines could be on the bottom die 280B (or vice versa). Driving both the odd and even wordlines in an array of one of the dies is therefore achieved using the string drivers on both dies. Thus, the string drivers for driving both the wordlines on the die 280A and the wordlines on the die 280B are located across both dies. In contrast, conventional 3D flash components drive both even and off wordlines with string drivers on the same die as the array and wordlines being driven. Thus, for two arrays, a conventional component would include twice as many string drivers compared to the example of FIG. 2A.

In the example illustrated in FIG. 2A, the component includes vias 286A and 286B through the CMOS circuitry and substrates to couple the CMOS circuitry 282A with the CMOS circuitry 282B. Typically, vias are not formed through the CMOS, but above the CMOS to couple the CMOS to the array (for CuA). Forming vias through the CMOS poses potential challenges. For example, different voltages between the substrate and the vias may cause a parasitic path of current from the string drivers to the substrate. To prevent potential leakage, insulating liners can be added to the vias in the CMOS. Additionally, because each string driver is driving higher capacitance (e.g., double the capacitance compared to a conventional string driver), the string drivers of FIG. 2A include larger transistors compared to conventional string drivers. Also, relative to conventional 3D flash storage components, the example illustrated in FIG. 2A enables improved routing and increased signal density. For example, the routing in the string driver is improved because you can combine all of the metal lines in both wafers for the routing of the wordlines.

FIG. 2B also illustrates two wafers bonded together, but the wafers are bonded with the top metal layers 290C and 290D facing one another. Although both metal layers 290C and 290D are illustrated in FIG. 2B, one of the metal layers 290C or 290D could be eliminated. Eliminating one of the metal layers could reduce cost (in terms of both material and processing). Because the metal layers 290C and 290D are between the arrays 281C and 281D and between the CMOS circuitry 282C and 282D, the example in FIG. 2B does not include vias through the CMOS. Therefore, the component illustrated in FIG. 2B does not face the challenge mentioned above with respect to FIG. 2A regarding potential current leakage due to the through CMOS vias. However, the lack of vias through the middle of the component to couple the CMOS circuitry of each die poses other potential challenges. Other interconnects, either outside the array or through the array, couple the CMOS circuitry 282C with 282D. Thus, the CMOS is not connected directly with a via, instead is goes through many (up to all) of the metal/via stack in both die. The wafer-to-wafer bonding only connects the top of the metal stacks together in this example.

Like the component illustrated in FIG. 2A, although FIG. 2B does not illustrate bonding pads between the conductive interconnects 290C and 290D, bonding pads can be included that are similar to or the same as the bonding pads 242 of FIG. 1A. The 3D flash component may also include bonding pads at the top and/or bottom to couple the component with circuitry external to the component (e.g., at the package level). In order to couple the conductive interconnects 290C and 290D with bonding pads at the top and/or bottom, there may be vias formed through the CMOS 282C and 282D. However, unlike the vias 286A of FIG. 2A, the vias to couple the conductive interconnects with upper or lower bond pads would be located at (e.g., under or above) the bond pads.

Figure 3A:
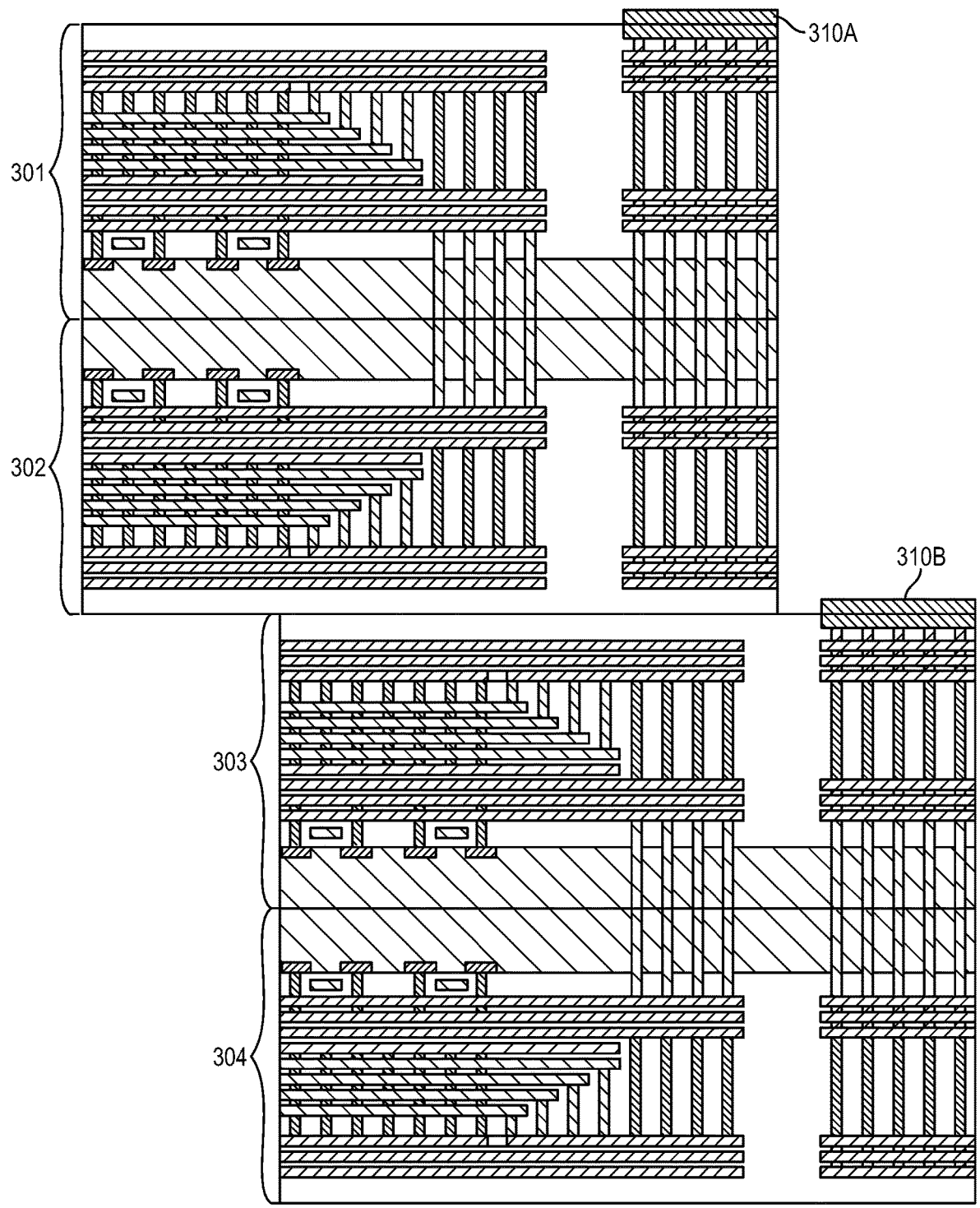
FIG. 3A illustrates an example of a technique for stacking bonded 3D flash storage dies in a package.
Figure 3B:
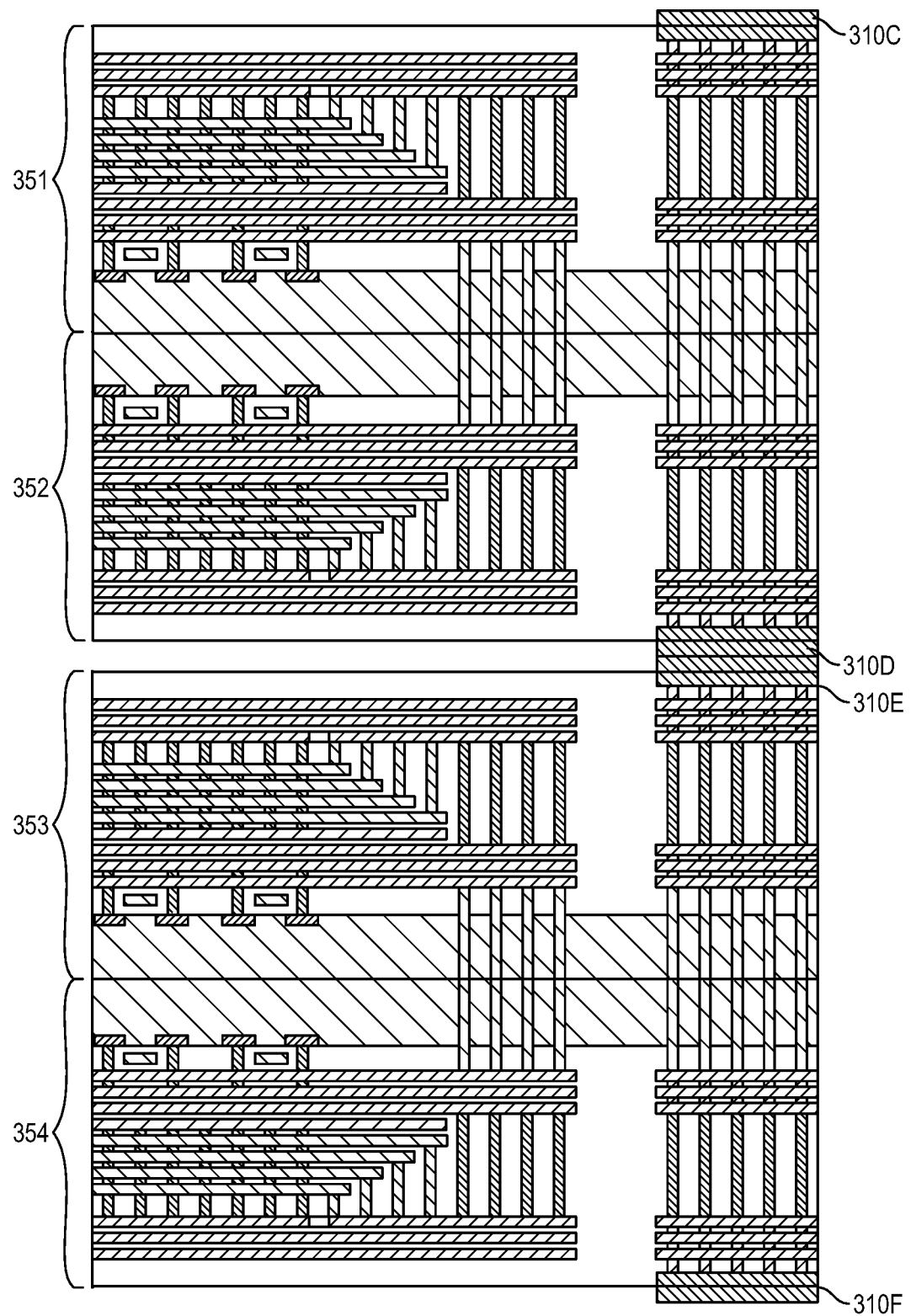
FIG. 3B illustrates an example of a technique for stacking bonded 3D flash storage dies in a package.

FIGS. 3A and 3B illustrate examples of different techniques for stacking and connecting the bonded 3D flash storage dies in the package. FIG. 3A illustrates staggered dies and FIG. 3B illustrates an example of vertically stacked dies with emulated vias to connect the dies at the package level. FIGS. 3A and 3B each illustrate four 3D flash storage dies (or two die pairs). For example, FIG. 3A illustrates dies 301, 302, 303, and 304. The dies 301 and 302 are bonded together via wafer bonding techniques described above. The dies 303 and 304 are also bonded together via wafer bonding. Similarly, the dies 351 and 352 of FIG. 3B and dies 353 and 354 are bonded together via wafer bonding techniques. In the examples illustrated in FIGS. 3A and 3B, the dies are bonded together with their respective CMOS circuitry facing one another, such as in FIGS. 1A and 2A. Thus, the dies 301 and 302 include at least some shared CMOS circuitry on those bonded dies, and the dies 303 and 304 include at least some shared CMOS circuitry. Similarly, the dies 351 and 352 include at least some shared CMOS circuitry, and the dies 353 and 354 include at least some shared CMOS circuitry. The die pairs are then stacked (but not bonded together like the dies in the die pair) on top of one another in the package. In the illustrated example, the die pair including dies 301 and 302 is stacked over the die pair including dies 303 and 304. Similarly, the die pair including dies 351 and 352 is stacked over the die pair including dies 353 and 354.

FIG. 3A illustrates an example in which the bonded dies are staggered like shingles. Thus, a portion of the surface of each pair of bonded dies (e.g., the top surface of the die 301 and a portion of the top surface of the die 303) is exposed to enable connecting the pair to external circuitry or contacts at the package level. A bonding pad (e.g., a wire bonding pad, such as the pads 310A and 310B) can be placed on the exposed portion of the surface for connecting to the external circuitry or contacts. Wires can then be bonded to the bonding pads 310A and 310B. Thus, in addition to bonding pads (if present) between the dies 301 and 302 and between the dies 303 and 304, the wire bonding pads enable access to each die pair at the package level.

FIG. 3B illustrates another example of bonding and connecting two die pairs. In contrast to the staggered approach of FIG. 3A, the dies in FIG. 3B are directly stacked over one another. Each die pair includes a bonding pad at its top and bottom surfaces. For example, the dies 351 and 353 include bonding pads on their top surfaces (bonding pads 310C and 310E, respectively) and the dies 352 and 354 include bonding pads on their bottom surfaces (bonding pads 310D and 310F, respectively). The die pairs are then bonded together at the wafer bonding pads 310D and 310E to electrically couple the dies to external circuitry or contacts. In the example illustrated in FIG. 3B, wires do not need to be bonded to each die or die pair but can be bonded to only one bonding pad (e.g., the top bonding pad 310C) to access each of the dies (e.g., each of the dies 351, 352, 353, and 354). Thus, the vias through the CMOS, the conductive interconnects of each die, and the bonding pads 310D and 310E between the die pairs emulate vias extending from the top die 351 to the bottom die 354. Therefore, the effect of a via can be achieved without needing to etch through the entire stack of dies to generate a single via through the entire stack. Although only four dies (two die pair) are shown in each stack, more dies (e.g., 8 or more) can be stacked using the techniques described.

Figure 4A:
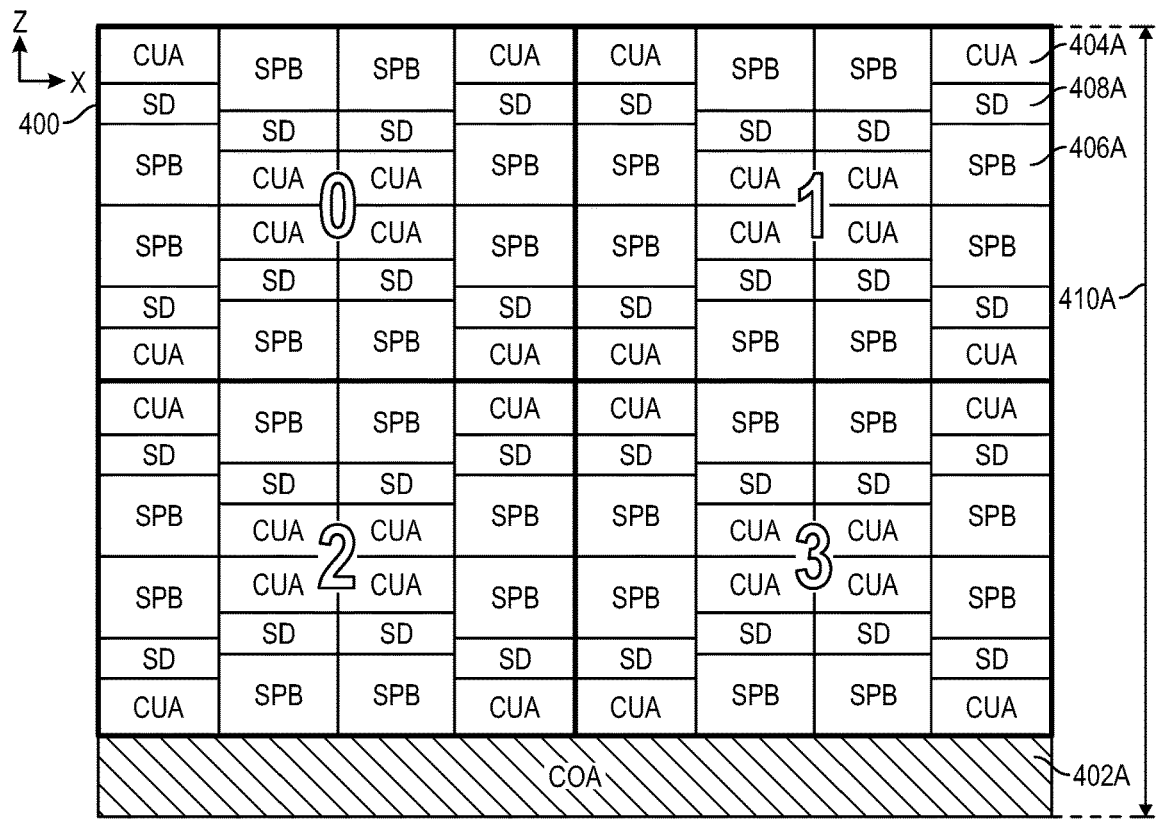
FIG. 4A illustrates a top-down view of a chip plan showing CMOS circuitry for accessing a 3D flash storage array.

FIG. 4A illustrates a top-down view of a chip plan showing CMOS circuitry for accessing a 3D flash storage array. The chip plan illustrated in FIG. 4A shows one possible layout of CMOS circuitry, including the CMOS outside the array (COA) 402A, the CMOS under the array (CUA) 404A, the static page buffers (SPB) 406A, and string drivers (SD) 408A. The COA 402A is located external to the array (i.e., not under or above the array), and the remaining CMOS circuitry is under (or above) the array. The CUA 404A can include CMOS circuitry such as control logic, charge pumps, and/or other CMOS circuitry. The numbers 0, 1, 2, and 3 are plane numbers denoting different planes.

Figure 4B:
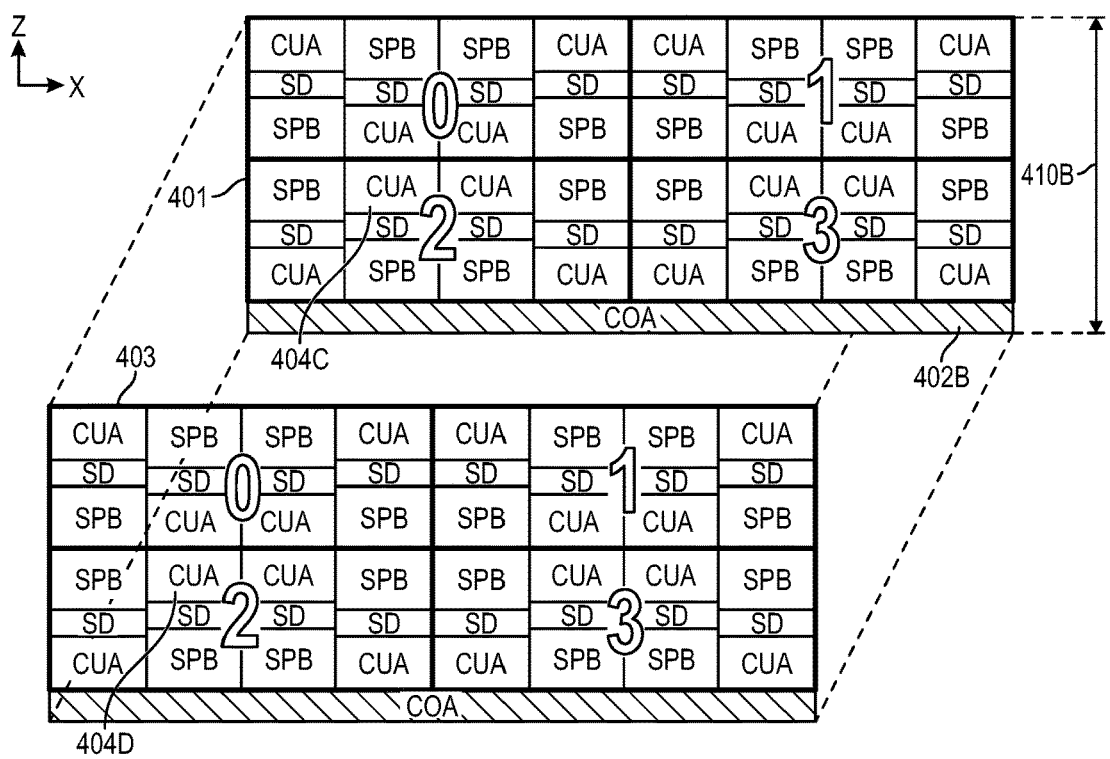
FIG. 4B illustrates a top-down view of a chip plan showing shared CMOS circuitry for accessing a 3D flash storage array using wafer-to-wafer bonding.

FIG. 4B illustrates a top-down view of a chip plan showing shared CMOS circuitry for accessing a 3D flash storage array using wafer-to-wafer bonding. The chip plan illustrated in FIG. 4B illustrates the plan for two dies 401 and 403 to be bonded together via wafer-to-wafer bonding. Like in FIG. 4A, the numbers 0, 1, 2, and 3 are plane numbers denoting different planes. In the example illustrated in FIG. 4B, each die 401 and 403 includes CMOS outside the array (COA), CMOS under the array (CUA), static page buffers (SPB), and string drivers (SD). However, as mentioned above, the dies may include different types of control circuitry (such as circuitry using one class of transistors on one die and circuitry using another class of transistors on another die). In this example, the die 401 is to be stacked on top of the die 403 and bonded (at the wafer level prior to dicing). The length 410B of each die in the z direction is half the length 410A of the die 400 of FIG. 4A. Thus, the area available for CMOS circuitry in each die 401 and 403 is half the area available in the die 400. In the illustrated example, the COA 402B is half the length as the COA 402A, and the area for CUA, SD, and SPB available in each die 401 and 403 is half the available area relative to the die 400. However, the total available area for CMOS circuitry in FIG. 2B is the same given that there are two stacked dies 401 and 403, causing the stacked dies to be twice as thick (in the y direction, which would be coming out of the page in FIGS. 4A and 4B).

Stacking and bonding the dies so that the CMOS circuitry of each die is adjacent to one another can have several advantages. As mentioned above, the size of the stacked dies in FIG. 4B is half as long but twice as thick as the die in FIG. 4A. A small footprint in the z-x plane can be desirable for some packages. However, fewer of the die pairs of FIG. 4B can be stacked in a given package than the dies of FIG. 4A. One benefit of the stacked bonded dies of FIG. 4B is that the "islands" of CMOS circuitry on each of the dies can be placed adjacent to one another, enabling easier and better communication between the CMOS islands. For example, referring to FIG. 4A, the CMOS circuitry is distributed across the z-x plane in pockets or islands. Routing and connecting all the islands (e.g., all the islands labeled CUA) with one another can be difficult. For example, routing for the CMOS in FIG. 4A can involve metal lines on the edges, above, below, and/or through the array. Not only is routing difficult, but long signal lines slow down the operation of the CMOS circuitry.

In contrast, connecting islands of CMOS circuitry that are stacked on top of one another and bonded via wafer-to-wafer bonding is simpler. For example, if the die 401 is stacked on top of the die 403, the CUA 404C will be above the CUA 404D, forming a CUA island with greater area than the CUA islands of FIG. 4A. Therefore, the CUA 404C can be electrically coupled with the CUA 404D without vias and without routing through or around other circuitry. By stacking and bonding the dies 401 and 403, the area available for a given island in FIG. 4B is double the size relative to the area in FIG. 4A.

Figure 5:
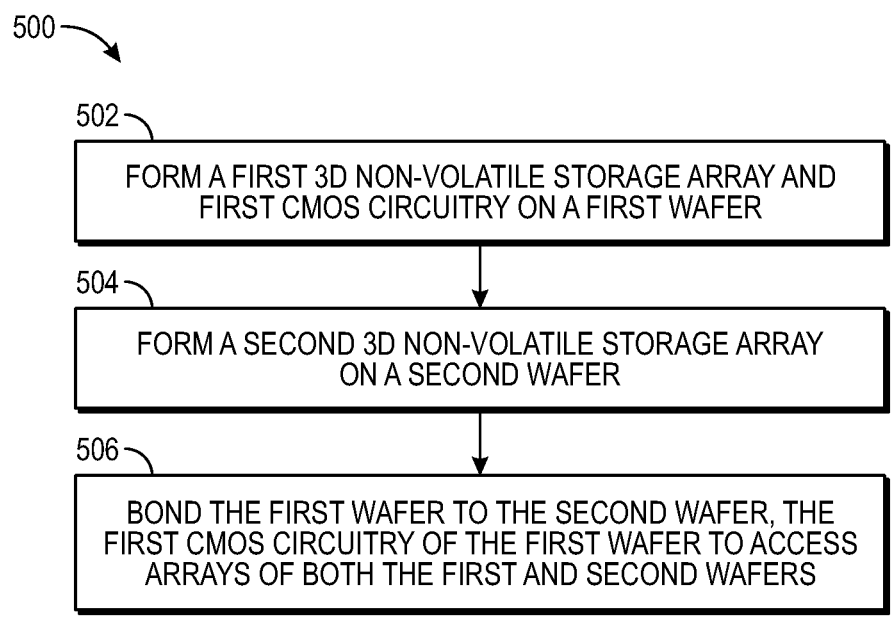
FIG. 5 is a flow diagram of an example of a method of forming a 3D flash storage component with shared CMOS circuitry and multiple dies bonded together via wafer to wafer bonding.

FIG. 5 is a flow diagram of an example of a method of forming a 3D flash storage device with shared CMOS circuitry and multiple dies bonded together via wafer-to-wafer bonding. The method 500 of FIG. 5 can be used to form a 3D flash storage component such as the component illustrated in FIG. 1A, 1B, 2A, or 2B.

The method 500 begins with forming 3D non-volatile storage arrays on two wafers, at operations 502 and 504. Shared CMOS circuitry is also formed in or on at least one of the wafers. Forming the arrays and CMOS circuitry involves multiple processing steps, including the deposition, doping, and etching of various materials to form the arrays and control circuitry. After forming the first and second storage arrays and the shared CMOS circuitry, the wafers are bonded together at operation 506. Bonding the wafers together involves wafer-to-wafer bonding techniques to either bond together bonding pads that are attached to the wafers or to bond the wafers together at conductive contacts of the wafers. Wafer-to-wafer bonding with sub-micron alignment accuracy is feasible and can involve the following process flow. First the wafers are cleaned and the surfaces are activated (by surface treatment) to enhance the bonding. This is followed by the wafers being aligned using face to face (F2F) precision optical alignment, which enables sub-μm alignment precision. Once aligned, wafers are bonded by thermal-compression in a regular cleanroom atmosphere.

Optimized tooling and process sequences can ensure that sub-μm alignment precision is maintained across the entire wafer.

Figure 6A:
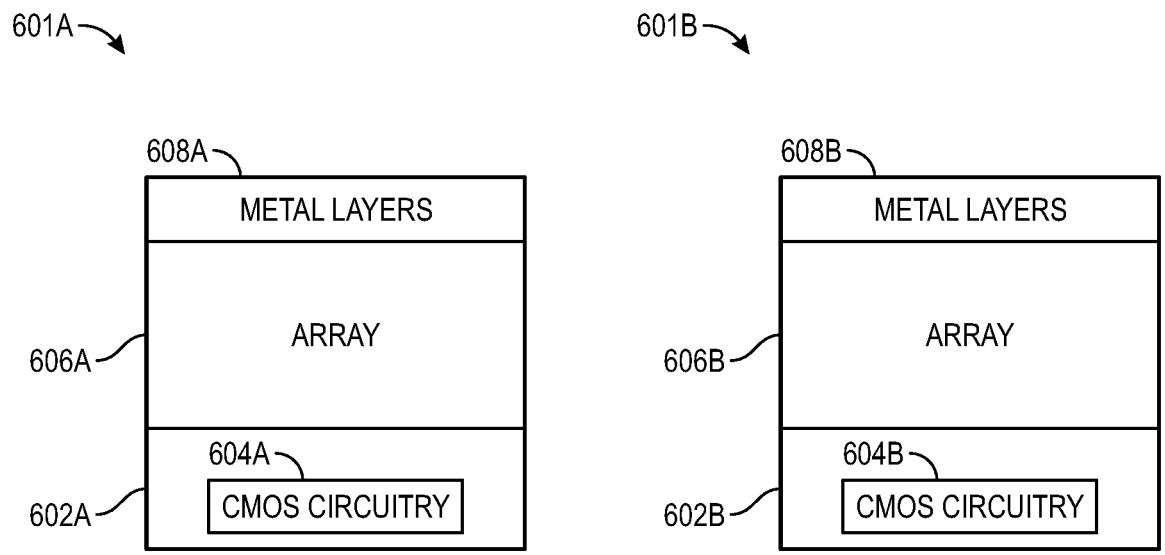
FIGS. 6A, 6B, 6C, and 6D illustrate an example of a 3D flash component with shared CMOS circuitry in various stages of processing.

FIGS. 6A-6D show cross sections of a 3D flash component in various stages of processing, in accordance with an example method such as the method 500 of FIG. 5. FIG. 6A shows a portion of a first wafer 601A and a portion of a second wafer 601B. The wafers 601A and 601B each include a substrate 602A and 602B, respectively. In the example shown in FIG. 6A, CMOS circuitry 604A and 604B is formed in the substrate of both wafers 601A and 601B. However, in other examples only one of the wafers includes CMOS circuitry. One or both of the CMOS circuitries 604A and 604B can include shared CMOS circuitry. Over the CMOS circuitry, the storage arrays 606A and 606B are formed, and over the arrays metal layers 608A and 608B are formed, which can couple the arrays with external contacts and/or circuitry.

Figure 6B:
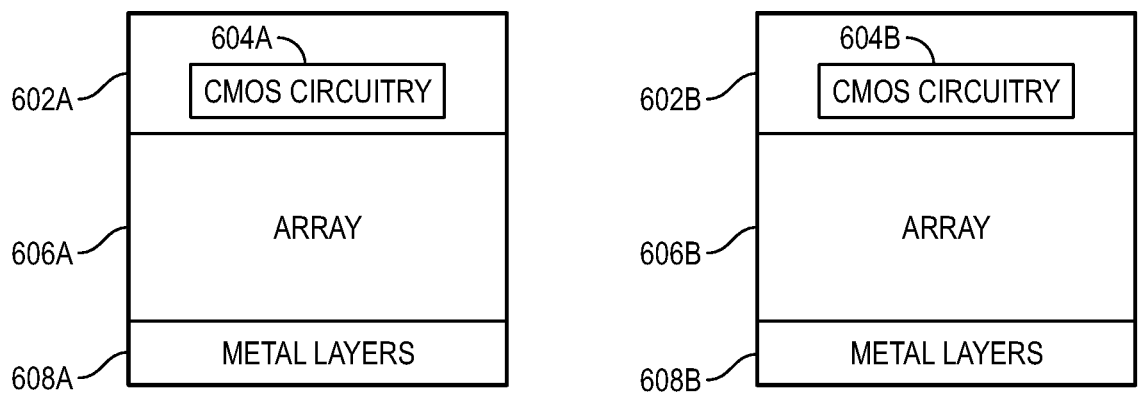
Figure 6C:
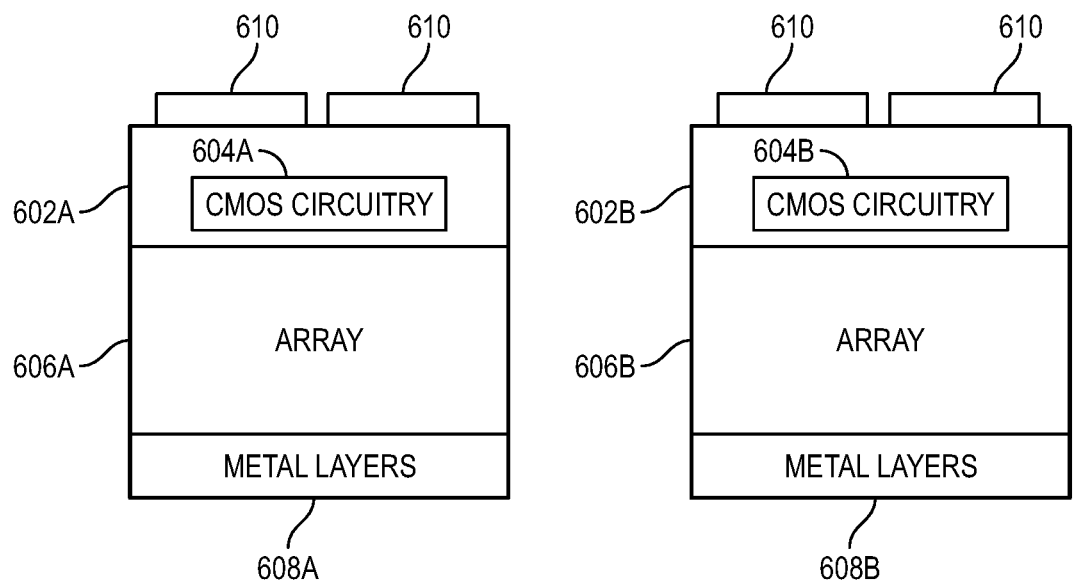
Figure 6D:
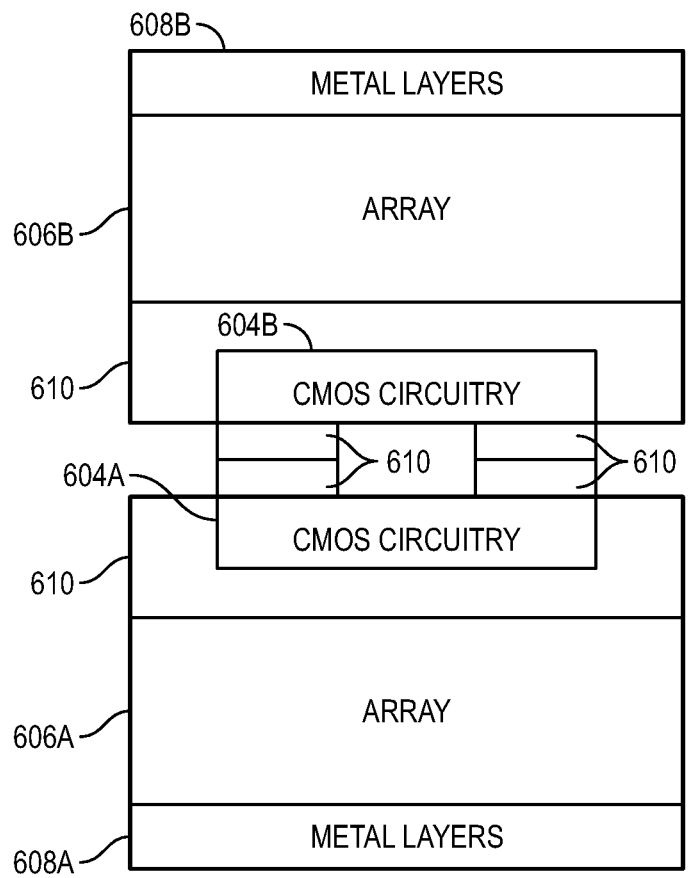

FIGS. 6B-6D illustrate an example using bonding pads. Referring to FIG. 6B, first the wafers 601A and 601B are flipped over so that the backside of the wafers (e.g., the side of the wafers with the CMOS circuitry) is facing up. Then, the backsides of the wafers are thinned to expose conductive contacts of the CMOS circuitry 604A and 604B. After thinning the backsides of the wafers 601A and 601B, wafer bonding pads 610 are attached to the backsides of the wafers, as illustrated in FIG. 6C. One of wafers is then flipped again so that the wafer bonding pads 610 attached to each wafer are facing each other and the wafers are bonded at the bonding pads 610, as illustrated in FIG. 6D.

After the wafers are bonded, the wafers can be diced into individual dies and packaged with other logic such as a flash controller to form a 3D flash storage device. By bonding the wafers at the CMOS circuitry, the CMOS circuitry on one or both dies can be shared to access the arrays 606A and 606B on both dies.

Figure 7:
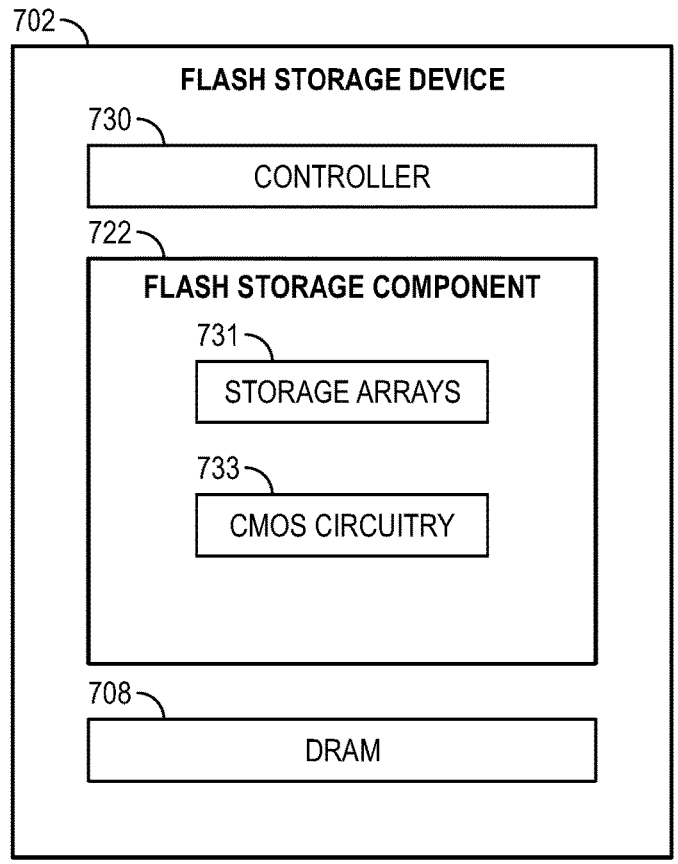
FIG. 7 illustrates an example of a block diagram of flash storage device in which wafer bonding and shared CMOS circuitry can be implemented.

FIG. 7 illustrates a block diagram of a flash storage device 702 in which wafer bonding and shared CMOS circuitry can be implemented, in accordance with one example. Although the term flash storage is used for device 702 and throughout this disclosure, a flash storage device can also be referred to as a flash memory device. In one example, the flash storage device 702 is a solid-state drive (SSD) that includes a flash storage component 722. The flash storage component 722 includes nonvolatile storage arrays 731 for storing data. The flash storage component 722 also include CMOS circuitry 733 to access the storage arrays 731. The flash storage component 722 can include multiple dies bonded together, as discussed above. Each die can include a storage array and shared CMOS circuitry on a given die enables access to arrays on multiple dies. Although a single flash storage component is illustrated in FIG. 7, the flash storage device 702 can include more than one flash storage component.

In one example, the flash storage device 702 can be a flash-based drive connected to a processor using a PCI Express (PCIe), serial advanced technology attachment (ATA), a parallel ATA, and/or a universal serial bus (USB) interface. The storage arrays 731 can include one or more of NAND flash, NOR flash, phase change memory (PCM), phase change memory with switch (PCMS), resistive memory, or other nonvolatile storage media. Data may be stored in single level cell (SLC), triple level cell (TLC), Quad level cell (QLC) and/or multi-level cell (MLC) format.

In addition to the nonvolatile storage 731, the flash storage device 702 can also include DRAM 708 (or other volatile memory). The DRAM 708 includes volatile memory that can store data while the flash storage device 702 is powered on (e.g., operational). The DRAM can comply with a standard promulgated by the Joint Electron Device Engineering Council (JEDEC), such as JESD79F for DDR Double Data Rate (DDR) SDRAM, JESD79-2F for DDR2 SDRAM, JESD79-3F for DDR3 SDRAM, JESD79-4A for DDR4 SDRAM, LPDDR3 (low power dual data rate version 3, original release by JEDEC (Joint Electronic Device Engineering Council) JESD209-3B, August 2013 by JEDEC), LPDDR4 (LOW POWER DOUBLE DATA RATE (LPDDR) version 4, JESD209-4, originally published by JEDEC in August 2014, or other JEDEC standards (these standards are available at www.jedec.org). Other volatile memory may be used. Some flash storage devices do not include a DRAM (e.g., "DRAM-less" SSDs). In one such example, the flash storage device can include an SSD controller memory (not shown), such as an SRAM. The DRAM 708 can be used to store data related to the operation of the flash storage device 702, such as a logical-to-physical indirection table or other such information.

The flash storage device 702 also includes a controller 730 to control access to the storage component 722. In one example, the controller 730 includes an input/output (I/O) interface to the storage component 722 and includes an interface to the host (not shown in FIG. 7). The controller 730 includes hardware logic (e.g., command logic) to communicate to control the writing to storage 722 and reading from storage 722. Command logic includes circuitry to generate and issue commands to read the storage cells of the storage 731. The CMOS circuitry applies voltage strobes to read and write to the storage cells of the storage arrays 731 in response to commands from the controller 730. Thus, CMOS circuitry 733 include circuitry to decode commands from the controller 730 and apply read or write strobes to the memory cells in accordance with the received commands. The controller can also include error code correction (ECC) logic to detect and correct errors in data read from storage 731. The controller 730 may be an application specific integrated circuit controller (ASIC) device connected to an interface such as a serial ATA or an integrated drive electronics controller. In another example, the controller 730 includes a processor or other processing circuitry (not shown). In one example, the controller 730 may be included in a System-on-a-Chip (SoC) onto a single integrated circuit chip.

The flash storage device 702 can also include firmware (not shown). The firmware can perform a variety of functions such as translation, garbage collection, wear levelling, and other functions for the operation and optimization of flash storage device 702. In one example, the firmware can include the flash translation layer (FTL), which includes logic to provide indirection to identify the physical addresses space for logical addresses such as logical block addresses (LBAs) of requests received from file system.

The flash storage device 702 may exist within the confines of a computer's package (e.g., within a laptop/notebook or other computer) or the flash storage device 702 may also be accessed via a larger network such as a local area network (e.g., an Ethernet network), or even a wide area network (such as a wireless cellular network, the Internet, etc.).

Figure 8:
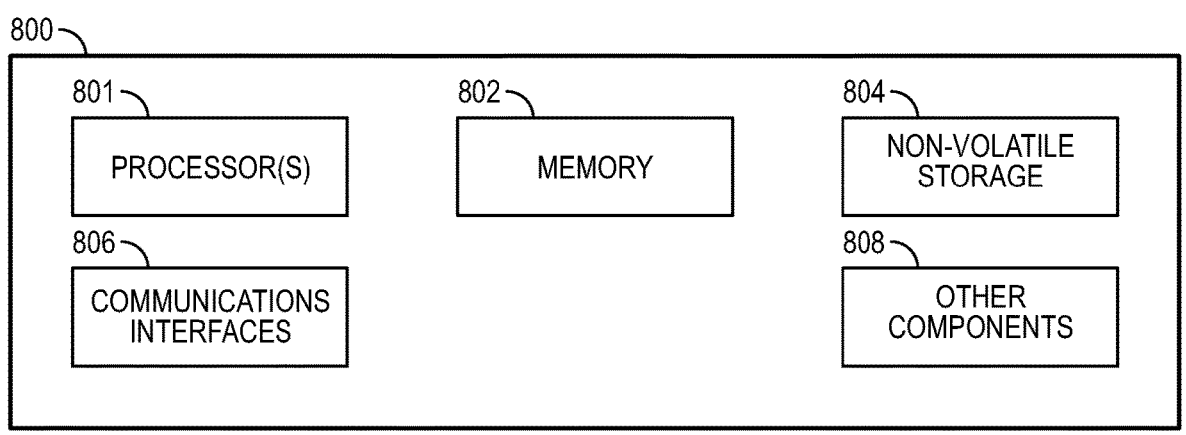
FIG. 8 provides an exemplary depiction of a computing system in which wafer bonding and shared CMOS circuitry can be implemented.

FIG. 8 provides an exemplary depiction of a computing system 800 (e.g., a smartphone, a tablet computer, a laptop computer, a desktop computer, a server computer, etc.). As observed in FIG. 8, the system 800 may include one or more processors or processing units 801 (e.g., host processor(s)). The processor(s) 801 may include one or more central processing units (CPUs), each of which may include, e.g., a plurality of general purpose processing cores. The processor(s) 801 may also or alternatively include one or more graphics processing units (GPUs) or other processing units. The processor(s) 801 may include memory management logic (e.g., a memory controller) and I/O control logic.

The system 800 also includes memory 802 (e.g., system memory), non-volatile storage 804, communications interfaces 806, and other components 808. The other components may include, for example, a display (e.g., touchscreen, flat-panel), a power supply (e.g., a battery or/or other power supply), sensors, power management logic, or other components. The communications interfaces 806 may include logic and/or features to support a communication interface. For these examples, communications interface 806 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 804, which may be the mass storage component of the system. The non-volatile storage 804 can be similar to, or the same as, the flash storage device 702 of FIG. 7, described above. Non-volatile types of memory may include byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), 3-dimensional (3D) cross-point memory structure that includes chalcogenide phase change material (e.g., chalcogenide glass) hereinafter referred to as "3D crosspoint memory", or a combination of any of the above. In one example, the non-volatile storage 804 may include mass storage that is composed of one or more SSDs. SSDs can be composed of flash memory chips that include shared CMOS circuitry and dies bonded via wafer-to-wafer bonding techniques as described above.

The following are some examples. In one example, a non-volatile storage device includes a first die including a first three-dimensional (3D) array of non-volatile storage cells and CMOS (complementary metal oxide semiconductor) circuitry and a second die vertically stacked and bonded with the first die, the second die comprising a second 3D array of non-volatile storage cells, at least a portion of the CMOS circuitry of the first die to access both the first 3D array of non-volatile storage cells of the first die and the second 3D array of non-volatile storage cells of the second die. In one such example, the CMOS circuitry of the first die is disposed between the first 3D array of non-volatile storage cells and the second 3D array of non-volatile storage cells. In one example, the second die further includes second CMOS circuitry to access the first and second 3D arrays of non-volatile storage cells. In one such example, a portion of shared CMOS circuitry is included in the first CMOS circuitry of the first die and a remaining portion of the shared CMOS circuitry is included in the second CMOS circuitry of the second die. The shared CMOS circuitry includes one or more of: charge pumps, static page buffers, IOs, control logic, and string drivers. In one example, the shared string driver circuitry is to access both the first and second 3D arrays of non-volatile storage cells, and a portion of the string driver circuitry for the first and second 3D arrays of non-volatile storage cells is included in the CMOS circuitry of the first die and a remaining portion of string driver circuitry is included in the second CMOS circuitry of the second die. In one example, the portion of the shared CMOS circuitry on the first die includes a first class of transistors, and the remaining portion of the shared CMOS circuitry on the second die includes a second class of transistors. In one such example, the first class of transistors includes high voltage transistors and the second class of transistors includes low voltage transistors.

In one example, a third die vertically stacked and bonded with the first or second die, the third die including a third 3D array of non-volatile storage cells, the CMOS circuitry of the first die to access the third 3D array of non-volatile storage cells. In one example, layers of the first die are disposed in reverse order relative to the second die, and conductive contacts of the CMOS circuitry of the first die are bonded with conductive contacts of the second CMOS circuitry of the second die. In one example, the component includes bonding pads between the conductive contacts of the first CMOS circuitry and the conductive contacts of the second CMOS circuitry.

In one example, a system includes a processor and a non-volatile storage device coupled with the processor, the storage device including a first die comprising a first three-dimensional (3D) array of non-volatile storage cells and CMOS (complementary metal oxide semiconductor) circuitry to access the first 3D array of non-volatile storage cells and a second die vertically stacked and bonded with the first die, the second die comprising a second 3D array of non-volatile storage cells, the CMOS circuitry of the first die to access the second 3D array of non-volatile storage cells of the second die.

In one example, a three-dimensional (3D) NAND memory device includes a first die comprising a first three-dimensional (3D) array of non-volatile NAND memory cells and control circuitry and a second die vertically stacked and bonded with the first die, the second die comprising a second 3D array of non-volatile NAND memory cells, at least a portion of the control circuitry of the first die to access both the first 3D array of non-volatile NAND memory cells of the first die and the second 3D array of non-volatile NAND memory cells of the second die.

In one example, a method of manufacturing a non-volatile storage device involves forming, on a first wafer, a first 3D non-volatile storage array and first CMOS circuitry, forming, on a second wafer, a second 3D non-volatile storage array, the first CMOS circuitry to access both the first and second 3D non-volatile storage arrays, bonding the first wafer to the second wafer, dicing the bonded first and second wafers, and forming non-volatile storage devices with the diced bonded wafers. In one example, bonding the first wafer to the second wafer involves bonding conductive contacts of the first CMOS circuitry and with second conductive contacts of second CMOS circuitry of the second wafer. In one example, the method further includes flipping the first wafer, thinning a backside of the first wafer, wherein the first CMOS circuitry is disposed proximate to the backside of the first wafer, and attaching wafer bonding pads to the backside of the first wafer over conductive contacts of the first CMOS circuitry, wherein bonding the first wafer to the second wafer involves bonding the second conductive contacts of the second CMOS circuitry with the bonding pads attached to the first wafer.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine-readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Terms used above to describe the orientation and position of features such as 'top', 'bottom', 'over', 'under', and other such terms describing position are intended to clarify the relative location of features relative to other features, and do not describe a fixed or absolute position. For example, a wafer that is described as the top wafer that is above or over a bottom wafer could be described as a bottom wafer that is under or below a top wafer. Therefore, the illustrations and examples herein should be construed in an illustrative, and not a restrictive sense. The scope of the invention should be measured solely by reference to the claims that follow.

What is claimed is:
1. A non-volatile storage device comprising:
a first die comprising a first three-dimensional (3D) array of non-volatile storage cells and CMOS (complementary metal oxide semiconductor) circuitry; and
a second die vertically stacked and bonded with the first die, the second die comprising a second 3D array of non-volatile storage cells, at least a portion of the CMOS circuitry of the first die to access both the first 3D array of non-volatile storage cells of the first die and the second 3D array of non-volatile storage cells of the second die;
wherein the CMOS circuitry of the first die is disposed between the first 3D array of non-volatile storage cells and the second 3D array of non-volatile storage cells.
2. The non-volatile storage device of claim 1, wherein:
the second die further comprises second CMOS circuitry to access the first and second 3D arrays of non-volatile storage cells.
3. The non-volatile storage device of claim 2, wherein:
a portion of shared CMOS circuitry is included in the first CMOS circuitry of the first die and a remaining portion of the shared CMOS circuitry is included in the second CMOS circuitry of the second die, the shared CMOS circuitry including one or more of: charge pumps, static page buffers, IOs, control logic, and string drivers.
4. The non-volatile storage device of claim 3, wherein:
the portion of the shared CMOS circuitry on the first die includes a first class of transistors, and the remaining portion of the shared CMOS circuitry on the second die includes a second class of transistors.
5. The non-volatile storage device of claim 4, wherein:
the first class of transistors includes high voltage transistors and the second class of transistors includes low voltage transistors.

6. The non-volatile storage device of claim 2, wherein:
shared string driver circuitry is to access both the first and second 3D arrays of non-volatile storage cells; and
a portion of the string driver circuitry for the first and second 3D arrays of non-volatile storage cells is included in the CMOS circuitry of the first die and a remaining portion of string driver circuitry is included in the second CMOS circuitry of the second die.

7. The non-volatile storage device of claim 2, wherein:
layers of the first die are disposed in reverse order relative to the second die;
conductive contacts of the CMOS circuitry of the first die are bonded with conductive contacts of the second CMOS circuitry of the second die.

8. The non-volatile storage device of claim 2, further comprising:
bonding pads between conductive contacts of the first CMOS circuitry and conductive contacts of the second CMOS circuitry.

9. The non-volatile storage device of claim 1, further comprising:
a third die vertically stacked and bonded with the first or second die, the third die including a third 3D array of non-volatile storage cells, the CMOS circuitry of the first die to access the third 3D array of non-volatile storage cells.

10. A system comprising:
a processor; and
a non-volatile storage device coupled with the processor, the storage device comprising:
a first die comprising a first three-dimensional (3D) array of non-volatile storage cells and CMOS (complementary metal oxide semiconductor) circuitry to access the first 3D array of non-volatile storage cells; and
a second die vertically stacked and bonded with the first die, the second die comprising a second 3D array of non-volatile storage cells, the CMOS circuitry of the first die to access the second 3D array of non-volatile storage cells of the second die;
the CMOS circuitry of the first die is disposed between the first 3D array of non-volatile storage cells and the second 3D array of non-volatile storage cells.

11. The system of claim 10, wherein:
the second die further comprises second CMOS circuitry to access the first and second 3D arrays of non-volatile storage cells.

12. The system of claim 11, wherein:
a portion of shared CMOS circuitry is included in the first CMOS circuitry of the first die and a remaining portion of the shared CMOS circuitry is included in the second CMOS circuitry of the second die, the shared CMOS circuitry including one or more of: charge pumps, static page buffers, IOs, control logic, and string drivers.

13. The system of claim 12, wherein:
the portion of the shared CMOS circuitry on the first die includes a first class of transistors, and the remaining portion of the shared CMOS circuitry on the second die includes a second class of transistors.

14. The system of claim 13, wherein:
the first class of transistors includes high voltage transistors and the second class of transistors includes low voltage transistors.

15. The system of claim 11, wherein:
shared string driver circuitry is to access both the first and second 3D arrays of non-volatile storage cells; and
a portion of the string driver circuitry for the first and second 3D arrays of non-volatile storage cells is included in the CMOS circuitry of the first die and a remaining portion of string driver circuitry is included in the second CMOS circuitry of the second die.

16. The system of claim 10, further comprising:
a third die vertically stacked and bonded with the first or second die, the third die including a third 3D array of non-volatile storage cells, the CMOS circuitry of the first die to access the third 3D array of non-volatile storage cells.

17. A three-dimensional (3D) NAND memory device comprising:
a first die comprising a first three-dimensional (3D) array of non-volatile NAND memory cells and control circuitry; and
a second die vertically stacked and bonded with the first die, the second die comprising a second 3D array of non-volatile NAND memory cells, at least a portion of the control circuitry of the first die to access both the first 3D array of non-volatile NAND memory cells of the first die and the second 3D array of non-volatile NAND memory cells of the second die;
the control circuitry of the first die is disposed between the first 3D array of non-volatile NAND memory cells and the second 3D array of non-volatile NAND memory cells.

* * * * *